US006941417B1

(12) United States Patent
Abdollahi-Alibeik et al.

(10) Patent No.: US 6,941,417 B1
(45) Date of Patent: Sep. 6, 2005

(54) HIGH-SPEED LOW-POWER CAM-BASED SEARCH ENGINE

(76) Inventors: Shahram Abdollahi-Alibeik, 739 Cambridge Ave., Menlo Park, CA (US) 94025; Mayur Vinod Joshi, 150 Pasito Ter. #608, Sunnyvale, CA (US) 94086

( * ) Notice: Subject to any disclaimer, the term of this patent is extended or adjusted under 35 U.S.C. 154(b) by 233 days.

(21) Appl. No.: 10/017,676

(22) Filed: Dec. 14, 2001

Related U.S. Application Data

(60) Provisional application No. 60/255,796, filed on Dec. 15, 2000.

(51) Int. Cl.[7] .............................................. G06F 12/00
(52) U.S. Cl. .......................... 711/108; 711/216; 365/49
(58) Field of Search ........................ 711/108, 206, 216; 365/49; 709/238, 245, 213; 370/392, 389, 370/400, 351; 341/50

(56) References Cited

U.S. PATENT DOCUMENTS 5,938,736 A * 8/1999 Muller et al. ............... 709/243
6,069,573 A * 5/2000 Clark et al. .................... 341/50
6,665,297 B1 * 12/2003 Hariguchi et al. .......... 370/392
6,711,041 B2 * 3/2004 Pereira et al. ................ 365/49

OTHER PUBLICATIONS

Miyatake, H et al. A design for high-speed low-power CMOS fully parallel content-addressable memory macros, IEEE Journal of Solid-State Circuits, vol.: 36, Issue: 6, pp. 956-968, Jun. 2001.*

McAuley, A. et al., Fast routing table lookup using CAMs, IEEE, pp. 1382-1391, 1993.*

* cited by examiner

*Primary Examiner*—Pierre Bataille

(57) ABSTRACT

The disclosed invention presents a method and apparatus to a one dimensional prefix search problem. The problem consists looking up the best match to a word out of a table of one-dimensional prefixes. The invention addresses the problems with prior art of high power consumption, large silicon chip area for implementation and slow search speed. The prefix entries are divided in several subgroups. A function is described that can be efficiently implemented to determine which of these subgroups the presented word will find a best match in. Thus, it is necessary to search only this small subgroup of prefixes. This saves on power consumption as well as area. An efficient hardware embodiment of this idea which can search at a very high speed is also presented. The applications for this invention could include internet routing, telephone call routing and string matching.

15 Claims, 6 Drawing Sheets

| Destination IP Prefix | Outgoing Port |
|---|---|
| 171.54.32.21/32 | 4 |
| 171.54.32.0/24 | 3 |
| 171.54.0.0/16 | 8 |
| 171.54.126.0/24 | 7 |

HIGH-SPEED LOW-POWER CAM-BASED SEARCH ENGINE

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

1. Field of Invention

This invention relates generally to single dimensional search engines which could be used in electronic routers and switches.

2. Discussion of Prior Art

One of the most important applications for this invention is to perform address lookups in routers. A router is an electronic device that has several input and output ports. It receives data packets with destination addresses on each of these ports. The lookup function involves looking up these destination addresses in a table called a lookup table to determine which output port this particular data packet should be sent to, so that it gets to it's destination most efficiently. The router then sends the packet out of the output port determined by this lookup.

One method of doing this is to build a list of all the possible destinations and the best port to send a packet out of to reach each destination. Then each destination address can be searched in this table and the best outgoing port can be determined. However, in large networks like the internet the number of such destinations is so large that such a table becomes too large to be implemented in each routers. Another consideration is the maintenance of this table. Now each time a new destination is added to the network each router in the network has to be informed of this. This is very cumbersome for large networks.

Hence, to solve this problem, a prefix based lookup scheme is used to carry out routing in modern internet routers. The idea here is that the network is arranged in a hierarchical fashion and the addresses are allocated accordingly, somewhat similar to a postal address. For example take an imaginary postal address like 123, Some Street, Someville, Somestate, US. The zip code has been dropped to make the postal example more analogous. Thus, a letter with this address posted from anywhere in the world would first be sent to US. Next, the US postal system will direct the letter to Somestate, from where it will go to the city Someville and so on and so forth. Thus, this system eliminates the requirement for every post office in the world to have knowledge of where 123, Some Street is and how to deliver a letter to that address. Similarly prefixes allow the aggregation of entire sub-networks under one entry in the lookup table.

However, there are special cases that need to be taken care of Again falling back on the postal system analogy, from some places in Canada it is more efficient to send a letter to Alaska directly there rather than sending it first to the mainland US postal system. Thus, these Canadian postal offices would have a letter routing rule book that has two entries: send letters addressed to US to the mainland US postal system, send letter addressed to Alaska, US to the Alaska postal system. Here clearly the second rule has higher precedence over the first one. This can be expressed as longest prefix matching. Thus, one should use the rule with the longest or most specific prefix for routing decisions. Similarly, in routers the longer prefix has a higher priority than a shorter prefix. This is the basic concept behind CIDR (Classless Inter-Domain Routing) which is used in routers.

Even though this concept cuts down on the number of entries that need to be maintained in the routing table, nevertheless the number of entries in the routing tables of routers in the backbone of the internet are large at around 100,000 today. To provide for adequate margin for growth during the lifetime of these routers, currently routers are shipped with the ability to support one million entries. Today these address are 32 bit long (under a scheme called IPv4) but as the stock of available address are depleted, 128 bit long address (IPv6) are coming into use.

Another factor that is making this task difficult is that the speed of the links connecting these routers is growing with rapid advances in technology. The state of the art optical fiber links today can run at 10 Gbps (called OC-192). Considering that minimum sized (40 bytes) data packet are sent over links of this capacity a lookup speed of slightly over 30 million lookups per second is required. Systems currently in development will support link speeds of 40 Gbps (OC-768) requiring a lookup speed of over 120 million lookups per second. This lookup speed is required for each link to a router. A router may have several links connected to it. Thus, overall the problem is to search for the longest prefix match for each address among a million prefixes at the speed of several hundred lookups per second. Using just prior art this is a daunting problem. The parameters of interest are power consumption, number of chips required to store and search the table and the chip area of these chips, latency of search, and the rate at which the search can be performed.

An example of a lookup table used for forwarding is shown in FIG. 1. Each entry in this table is 32 bits wide. The first column contain the prefix with the prefix length after the 'l'. Each 32 bit address is grouped into four decimal numbers each representing 8 bits. The four decimal numbers are separated by a decimal point. For example the 32 bit long address 1010 1011 0011 0110 0010 0000 0001 0101 is 171.54.32.21 in this format.

Using these conventions, the entry, 171.54.32.0124, refers to the range of addresses from 171.54.32.0 to 171.54.32.255. Hence, the first 24 bits are defined while the last 8 bits are "don't care" bits. Another representation for the prefixes would be 171.54.32.X, where the X stands for "don't care". The outgoing port is in the next column. An incoming address can match multiple entries. In this case the entry with the longest prefix is chosen as the best match if a CIDR algorithm is desired. For example the word 171.54.32.123 matches two entries from the table in FIG. 1, namely 171.54.0.0/16 and 171.54.32.0/24. However since 171.54.32.0/24 is a longer prefix than 171.54.0.0/16, the best match is 171.54.32.0/24. Another method of establishing priority would be to actually specify the priority for each entry.

An alternate way to represent this table is shown in FIG. 2. Here each prefix is represented as a range along a number line (shown at the bottom of the figure). Since we are dealing with 32 bit prefix entries in this example, this number line extends from 0.0.0.0 to 255.255.255.255. Each prefix is a contiguous range on this number line. The prefixes from the table in FIG. 1 are shown on this number line. Note that the longer prefixes represent shorter ranges on this number line. If a longest prefix match is desired, then the first range that matches the address to be looked up going from top to bottom in FIG. 2 is the best match.

There are two general approaches to solving this problem. The first is to use a general CAM (Content Addressable Memory) to store and search the entire lookup table. Each CAM cells contains two memory elements to store three states (1,0,X or don't care) and comparison circuitry to compare the destination IP address to the stored entry. This approach results in large silicon area as well as large power consumption as every entry is searched.

The second approach is to store the lookup table as some data structure in conventional memory. For example see U.S. Pat. No. 6,011,795. This data structure is designed to allow efficient lookup using a particular algorithm. A specially designed integrated circuit is used to perform the lookup on this memory. While the power in this scheme can be low, it suffers from several drawbacks. Any data structure involves a lot of wastage due to either empty entries or pointers used to navigate the structure. The factor of real prefix data to memory used is 3–4 at best and can be as bad as 64. Secondly to run this lookup at a high speed, each level of this data structure has to be pipelined. This puts a large I/O requirement on the system. Which is difficult if not impossible to meet as the number of lookups required exceed 100 Million lookups per second. Hence current techniques are expensive and have unmanageable amount of worst-case power and I/O requirements. Another disadvantage is that the latency of these solutions can be large and also the worst-case latency may be much larger than the average case latency. This large and possibly uncertain search latency requires larger and more complex buffering of the data packets.

Objects and Advantages

Accordingly, to address the deficiencies of prior art several objects and advantages of the present invention are:

(a) It does not suffer from the high power requirements of usual CAM implementations allowing the use of cheaper packaging and higher density reducing the chip count. Power does not scale with increasing table size, unlike conventional implementations.

(b) It allows the use of a binary CAM structure in place of a ternary CAM (which can store don't cares) giving higher table entries per chip.

(c) It has low latency which is beneficial to applications like real time voice and video transmission.

(d) It can support a high lookup rate allowing the routing of a large amount of traffic.

(e) It allows several chips to be operated in parallel with ease, to support large lookup table sizes as there is no communication required between chips to decide the best match.

Further objects and advantages are to have a solution which is easy to design. Still further objects and advantages will become apparent form a consideration of the ensuing description and drawings.

BRIEF SUMMARY OF THE INVENTION

This invention provides a method and system an ASIC (Application Specific Integrated Circuit) with several CAM arrays to perform a single-dimensional prefix search on the prefixes stored in the said array such that as few as one CAM array is activate at a time. Each of these arrays are surrounded by special logic that activates only the necessary CAM array.

BRIEF DESCRIPTION OF THE SEVERAL VIEWS OF THE DRAWING

List of Figures

DETAILED DESCRIPTION OF THE INVENTION

Preferred Embodiment

In this section of the application, a preferred embodiment of the invention is described with regard to process steps and data structures. Those skilled in the art would recognize, after perusal of this application, that embodiments of the invention can be implemented using circuitry or other structures adapted to particular process steps and data structures, and that implementation of the process steps and data structures described herein would not require undue experimentation or further invention.

Although preferred embodiments are disclosed herein, many variations are possible which remain in the concept, scope and spirit of the invention, and these variations would be clear to those skilled in the art after perusal of this application.

The basic idea behind this invention is to divide the table of prefixes into smaller subgroups. This allows this invention to save on power and implementation area requirement as compared to prior art. To aid in understanding this invention, first the method of dividing a large table of prefixes into smaller subgroups will be described. Next the hardware to store, identify and search the correct subgroup will be described.

Basic Theoretical Concept

Figures 1, 2:
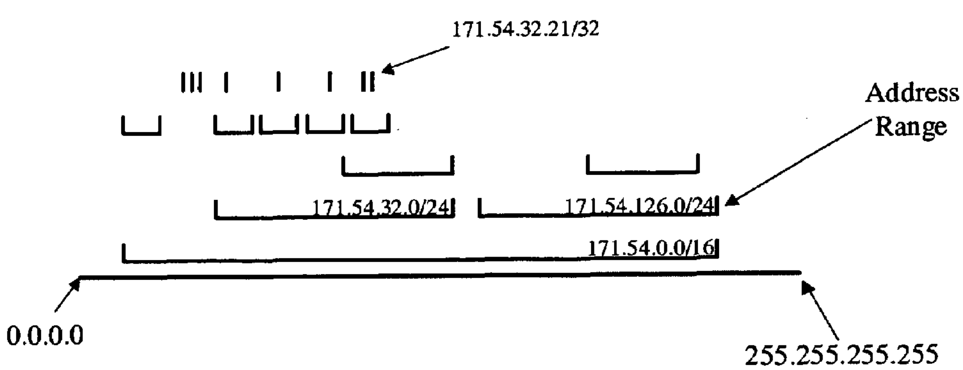
FIG. 1 shows an example of a forwarding lookup table with one dimensional prefixes.
FIG. 2 shows the representation of a one dimensional lookup table as ranges along a number line going from 0.0.0.0 to 255.255.255.255.
Figure 3:
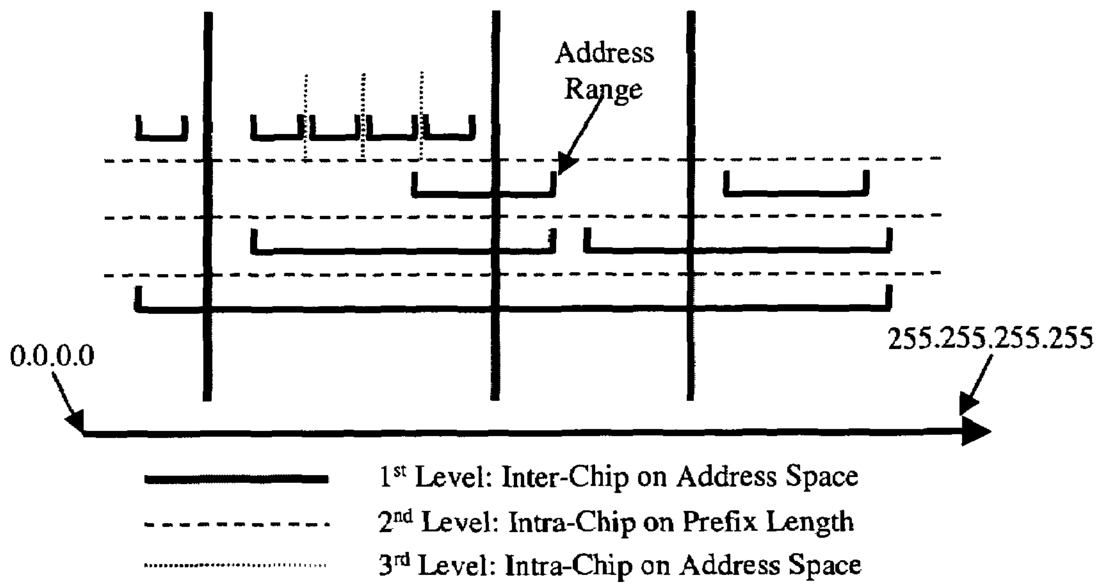
FIG. 3 shows the concept of dividing the lookup table into different subgroups depending on the location along the number line.

Searching entries takes power roughly proportional to the number of entries that need to be searched. This scheme saves power by searching only a few entries out of the entire table. The way the table is divided is shown in FIG. 3. Depending on the technology, chip size and table size, several chips may be required to save and search the entire table. Hence, the first division is between chips. Each chip contains entries from only a certain range of the address space. Entries that cross this boundary are put in both chips. Thus depending on the range in which the address to be matched falls, only one chip needs to be searched for it.

Within each chip the entries are divided into several packs. These packs will be referred to as banks. Each of these banks shares a mask entry, which stores the information on the significant bits in the prefix. This allows the entries to be stored in smaller binary CAMs instead of ternary CAMs, which are otherwise required. Since, each bank contains entries of the same length the entries cannot overlap with each other. Thus, each address will get at the most one match. This eliminates the need to have a priority encoder within each bank to resolve multiple matches. For these reasons the second division is based on prefix length.

The third division is from bank to bank. Depending on the number of entries in each prefix length on each chip several banks may be required to store these entries. Each bank contains entries contained in a particular address range. Each address lookup needs to only activate one of these banks per prefix length, further reducing the power requirement. A priority encoder is required between banks to determine which was the longest prefix match among the matches from different prefix lengths.

Figure 4:
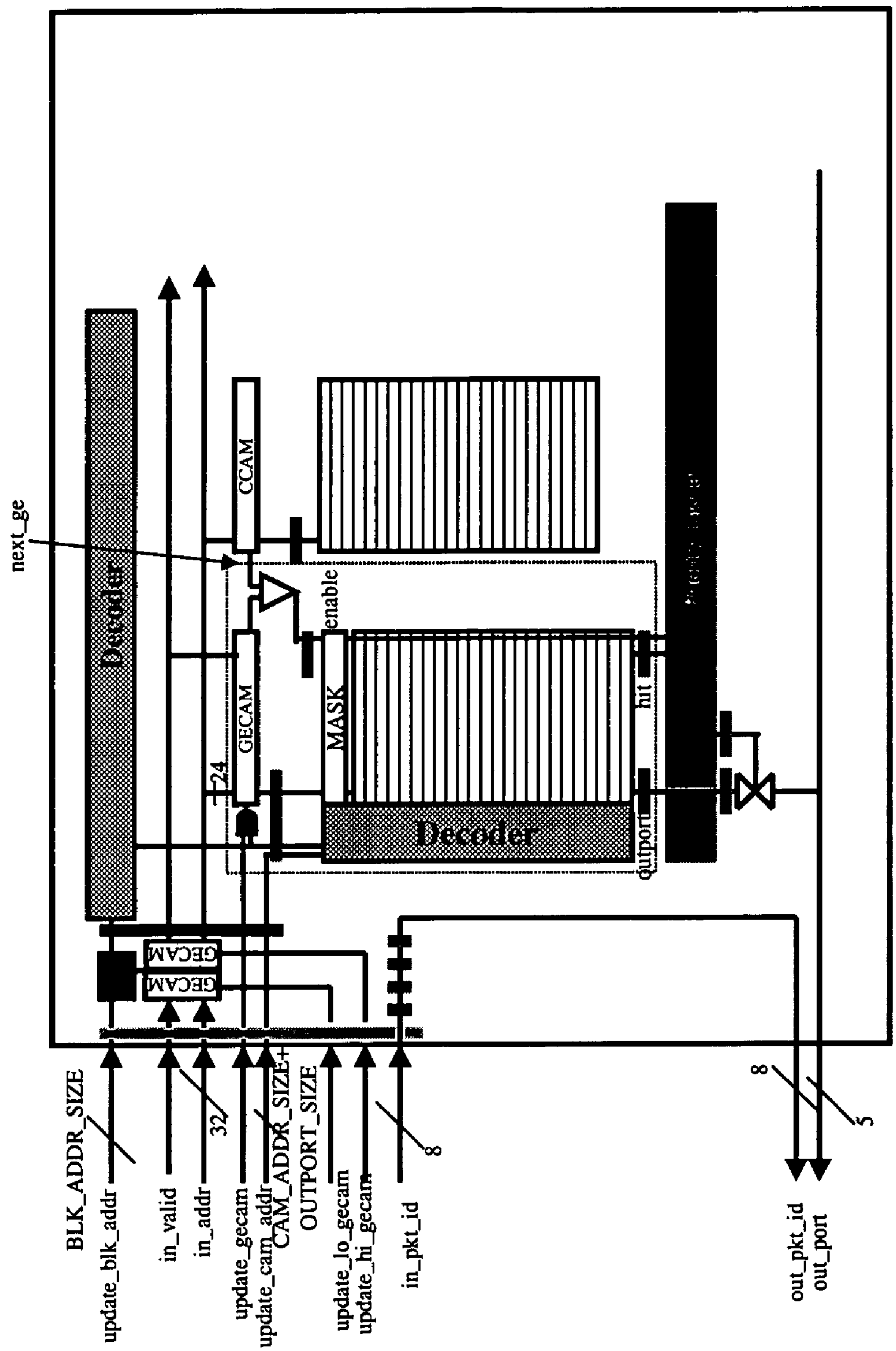
FIG. 4 Chip-level architecture of the preferred embodiment.

Note that depending on the specific application, technology used and table size, the number, order or type of this division can be changed to obtain the optimal design Hardware Description and Operation of Invention FIG. 4 shows the schematic of the implementation. Each thick solid line represents a flip-flop. Thus, the regions between flip-flops of the same color lie in the same clock domain. The functioning of this schematic will be explained by going through a lookup (an address) and add/delete prefix cycle.

Lookup:

A particular interface is assumed here for the sake of discussion. In a cycle in which there is an address to be looked up, the address is put on the in__addr bus, the packet ID is put on the in__pkt__id bus and in__valid is asserted. Next this address has to go through the first check to find out if it is in the same range as the address in this chip. This is the search on the first division. This search is done by the use of CCM (Content Comparing Memory). In this implementation, without loss of generality, CCM is used to compare the incoming data to that in the memory and computes if it is greater than or equal to the one in the memory. A possible implementation of the CCM is presented in the next sections.

So, in the next cycle the incoming address is compared against two CCMs to check if it is in the right range. The CCM contain the maximum and minimum of the range of address contained in that chip. Chips that do not have addresses in the right range do not have to do any further work on this address saving power. The chips that does match now passes on the address to the CAM banks in the next cycle.

Now, as mentioned before each of these CAM banks contain entries with the same prefix length. This prefix length is encoded in the mask present in each bank. The data in the mask decides which bits of the incoming address will be compared with the entries in the bank. Each CAM bank also contains a CCM. This CCM stores and compares the least possible address that will match the entries in the table with the incoming address. If the incoming address is found to be greater than or equal to the data in the CCM but less than (i.e. not greater than or equal to) the one in the next bank which contains addresses of the same prefix length, then and only then the incoming address is passed to the rest of the CAM bank for comparison. This requires CAM banks with prefixes of the same length to be placed next to each other and the addresses to be sorted between the banks. Note that the addresses within a bank need not be sorted as only one match can be made for entries of same prefix length. The last in a chain of CAM banks with same prefix length should not compare the incoming address with the next CAM bank (as that contains prefixes of different length). This is achieved by introducing the last bit. So for the last CAM bank in a chain (which has the last bit set) comparison is carried out only with one CCM.

In the next cycle the comparison within each CAM bank that matched (at the most one per prefix length) is carried out. The circuit operation and design of these CAM cells is detailed in the following sections and hence, will not be covered here. It is sufficient to say here that each row of CAM cells (which contain one entry) have an associated memory row (e.g. SRAM) containing the tag (which could be the port address that the packet needs to leave the router by). If a match is found between the incoming address and one of entries in the bank, corresponding tag is outputted and a hit line is asserted.

In the next cycle the priority encoder decides which of the CAM banks has got the longest prefix match. Again, the workings of the priority encoder are explained in detail in the following sections. The priority encoder decides the CAM banks with the highest priority and lets it output its tag (which is the longest prefix match) onto the out__port bus.

Update:

This section shall detail how the data structure is maintained. A processor that maintains the update engine gives the update commands. To allow lookups to take place without being held up by updates, each update command maintains the data structure intact. This requires all the CCMs and CAMs at various levels to be updated in one pipelined operation (so as to leave the data structure ready to do a lookup in the next cycle). This means that each update is one clock cycle long and updates each section as it travels down the pipeline. The lookup operation can resume after the clock cycle in which the update is introduced to the pipeline.

To add a new entry to a chip, the entry is placed on the in__addr bus and the corresponding tag is placed on the in__port bus and the packet__update is asserted. The bank address that this update is directed to is put on the update__blk__addr bus, while the row number within this bank is put on the update__cam__addr bus. Now, this addition might change the data structure, so as to require the modification of the following CCMs:

Bank CCM: If the entry is the smallest in that bank, the CCM content has to be updated. The update__ccm bus is asserted which ensures this. Note that the in__addr should contain the smallest address that matches the new entry. The mask in the CAM bank will ensure that the relevant bits are ignored during lookup.

Lo__CCM: This contains the lowest address than can get a match on this chip. Thus, if the incoming entry is the smallest in the chip, the update__lo__ccm is asserted. Again the in__addr bus should contain the smallest address that matches the new entry.

Hi__CCM: This contains the highest address that can get a match on this chip. Thus, if the incoming entry is the largest in the chip, the update__hi__ccm is asserted. In this case the in__addr bus should contain the largest address that matches the new entry. Note that this update will never require the concurrent updating of the bank CCM. So, putting the largest address on the in__addr bus will not cause a problem.

A delete is similar to an add, except that the entry is set to a special value that will never match a valid incoming address.

CCM Design: Since we have a large number of CCM also, we had to come up with a compact structure for this memory. We observed that for comparing our IP address with the CCM content, we can subtract these 2 numbers and see if the result is a negative number or not. In logic terms, this means that we have to 2's complement one of our numbers and add them together. If the overall addition result is positive (i.e. the extra bit for 2's complement is 1) there would be a carry generated, otherwise there would be no carry. We used a carry-chain architecture to implement our CCM.

It is not desirable to do a 2's complement operation on the IP number for each lookup. One solution is doing the 2's complement operation on the CCM content when it is stored during an update. Another solution is storing the original CCM content, but do the carry chain logic operations on the inverse of the stored value. In this case there should be a carry input to the carry chain. Since 2's complement of a binary number is equal to bitwise inverse of that number plus 1, the end result will be the same as the first solution.

Figure 5:
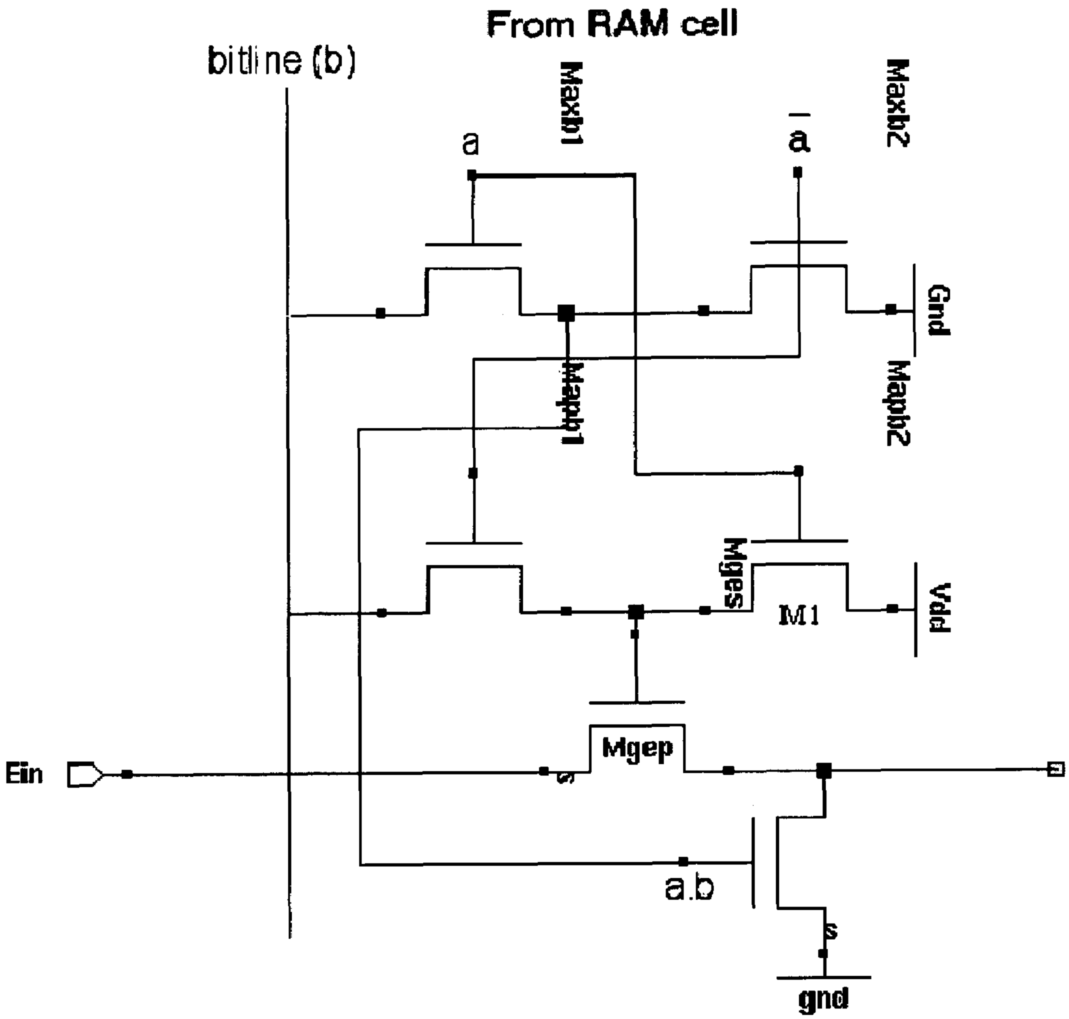
FIG. 5 Schematic of one possible implementation of comparing circuitry in one cell of the Content Comparing Memory.
Figure 6:
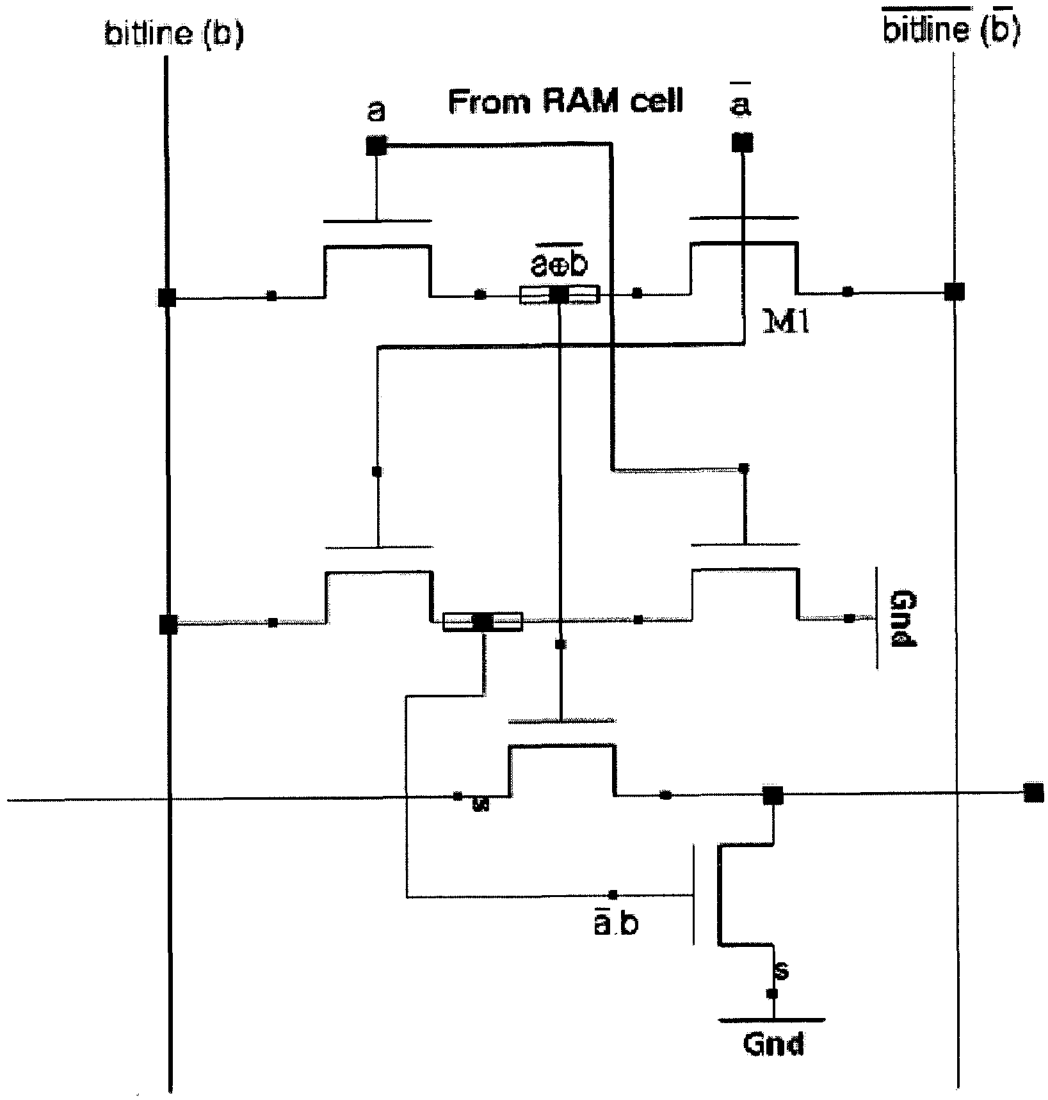
FIG. 6 Schematic of another possible implementation of comparing circuitry in one cell of the Content Comparing Memory.
Figure 7:
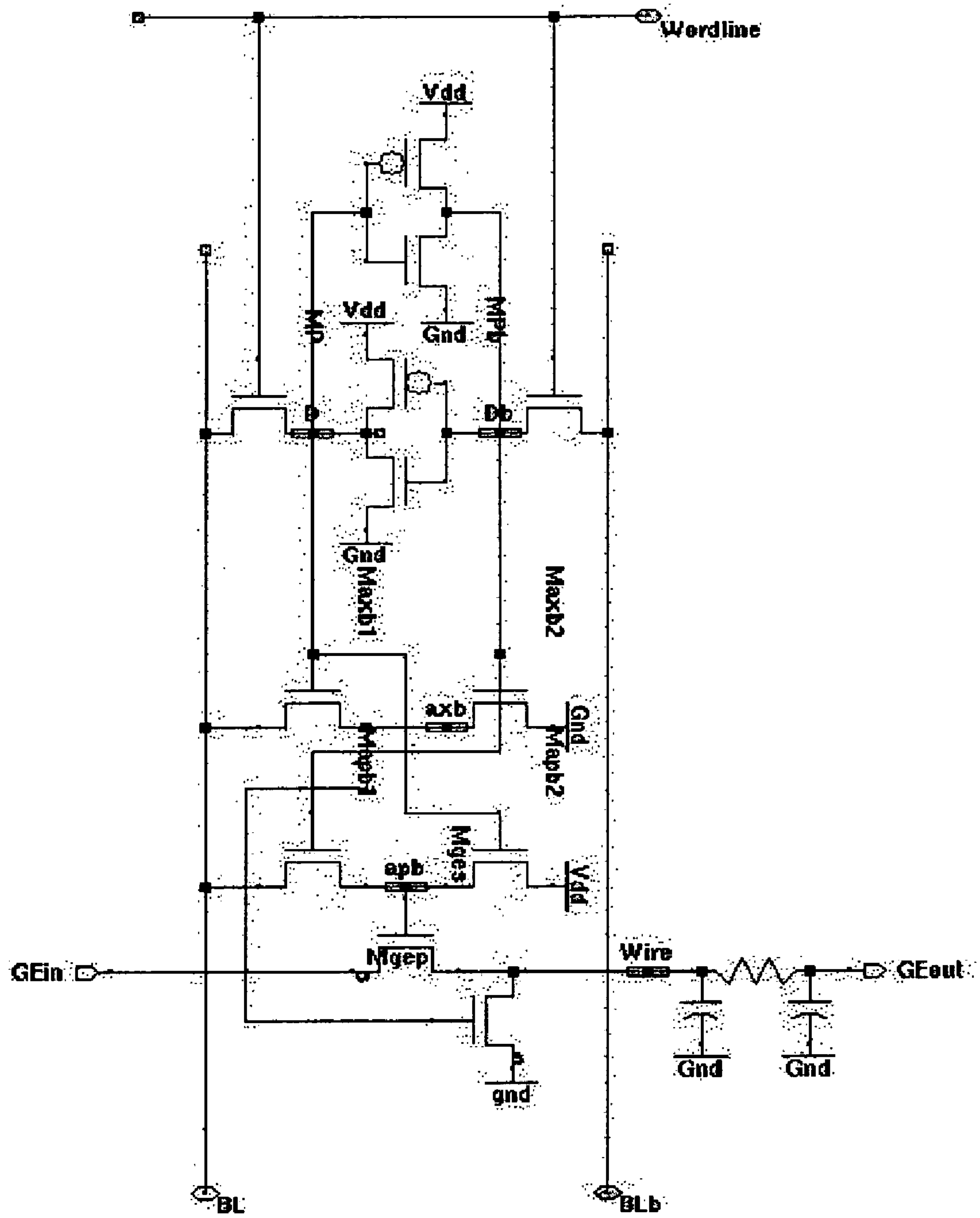
FIG. 7 Schematic of preferred embodiment of one complete cell of the Content Comparing Memory.

Effectively the CCM content is subtracted from the IP number each time and a carry is generated if the IP number is Greater than or Equal to CCM content. Two possible implementations are shown in FIG. 5 and FIG. 6 correspond to first and second solutions respectively. In both cases transistor M1 can be connected either to Vdd (done in FIG. 5 implementation) or to $\overline{\text{bitline}}$ (FIG. 6). Connection to $\overline{\text{bitline}}$ may make the overall cell size smaller. Of course there could be other implementations for generating the inputs to the series and parallel carry chain transistors.

Description and Operation of Alternative Embodiments

Although preferred embodiments are disclosed herein, many variations are possible which remain in the concept, scope and spirit of the invention, and these variations would be clear to those skilled in the art after perusal of this application.

(a) We are not limited to SRAM for implementing our CAM and CCM cells. Any kind of memory cell including DRAM can be used as the storage element (circuitry/device).

(b) In this implementation CCMs were used for doing the 'greater than or equal to' operation. In general CCMs can be used for any comparison operation.

(c) The word length for CAMs and CCMs does not have to be 32 bits. The same ideas explained in this report works for any arbitrary word length.

(d) The CAM bank size can be chosen arbitrarily.

(e) We had 3 levels of pre-classification in this implementation, out of which 2 of them where in the address space. The number of levels of pre-classification is not central to our idea and can be chosen as appropriate for the particular application.

(f) By providing multiple matchlines for each storage element in our CAMs, we can perform several lookups in parallel and further speed up our search.

What is claimed is:

1. A content comparing memory device for generating the carry bit or bits in the summation of a search binary word to at least one stored binary word, comprising a plurality of content comparing memory cells arranged in rows and columns, with each stored binary word stored in each of said rows, each of said content comparing memory cells comprising:

(a) a normal memory cell for storing the stored binary bit, (b) means for reading from and writing to said normal memory cell, (c) a signal line for delivering the search binary bit, (d) a first logic device which provides a carry transfer logical operation selected from the group consisting of logical XOR and logical OR of said search binary bit or its inverse and said stored binary bit or its inverse, (e) a second logic device which provides logical AND of said search binary bit or its inverse and said stored binary bit or its inverse, (f) an input port for delivering the carry-in value for the bit summation, (g) an output port for delivering the carry-out value of the bit summation, (h) said input port connecting to the output port of the previous content comparing memory cell in the row and said output port connecting to the input port of the next content comparing memory cell in the row, (i) said first logic device driving a passgate between said input port and said output port, said passgate transferring the carry-in value to said output port when turned on, (j) said second logic device driving said output port to a predetermined carry logical value indicating carry bit in the summation of said stored binary bit or its inverse and said stored binary bit or its inverse, whereby, the output port of the last content comparing memory cell in a row is driven to the said carry logical value if the summation of the stored binary word of said row, said search binary word, and the carry-in value applied to the input port of the first content comparing memory cell in said row generates a carry.

2. Content comparing memory device of claim 1, wherein said normal memory cell stores both said stored bit and its logical inverse.

3. Content comparing memory device of claim 1, further including an inverter for creating the logical inverse of said stored bit in each of said content comparing memory cells.

4. Content comparing memory device of claim 1, further including a signal line for delivering the inverse of said search binary bit in each of said content comparing memory cells.

5. Content comprising memory device of claim 4, wherein said normal memory cell stores both said stored bit and its logical inverse.

6. Content comparing memory device of claim 4, further including an inverter for creating the logical inverse of said stored bit in each of said content comparing memory cells.

7. Content comparing memory device of claim 1 wherein said first logic device and said second logic device are made from transmission gates, whereby, the device area becomes smaller.

8. Content comparing memory device of claim 7, wherein said normal memory cell stores both said stored bit and its logical inverse.

9. Content comparing memory device of claim 7, further including an inverter for creating the logical inverse of said stored bit in each of said content comparing memory cells.

10. Content comparing memory device of claim 7, further including a signal line for delivering the inverse of said search binary bit in each of said content comparing memory cells.

11. Content comparing memory device of claim 10, wherein said normal memory cell stores both said stored bit and its logical inverse.

12. Content comparing memory device of claim 10, further including an inverter for creating the logical inverse of said stored bit in each of said content comparing memory cells.

13. A method for comparing a search binary word to a stored binary word, comprising:

(a) providing a content comparing memory array of same length as said stored binary word which generates, at its output, the carry-out bit for the summation of a binary word applied to it, the binary word stored in the array, and a carry-in value applied at its input, (b) setting a logical carry-in value of 0 at said input of said content comparing memory, (c) selecting from the group consisting of:

storing the 2's complement of said stored binary word in said content comparing memory array, and, applying the 2's complement of said search binary word to said content comparing memory array, (d) observing the fact that when a number x is added to the 2's complement of a number y, said carry-out bit will be 1 if x>y and it will be 0 if x<y, whereby, from said output of said content comparing memory it can be judged whether said search binary word is larger than said stored binary word or not.

14. A method for comparing a search binary word to a stored binary word, comprising:

(a) providing a content comparing memory array of same length as said stored binary word which generates, at its output, the carry-out bit for the summation of a binary word applied to it, the binary word stored in the array, and a carry-in value applied at its input, (b) setting a logical carry-in value of 1 at said input of said content comparing memory, (c) selecting from the group consisting of:

storing the bitwise inversion of said stored binary word in said content comparing memory array, and, applying the bitwise inversion of said search binary word to said content comparing memory array, (d) observing the fact that when binary number 1 is added to the summation of a number x and the bitwise inversion of a number y, said carry-out bit will be 1 if x>y and it will be 0 if x<y, whereby, from said output of said content comparing memory it can be judged whether said search binary word is larger than said stored binary word or not.

15. A method for comparing a search binary word to a stored binary word, comprising:

(a) providing a content comparing memory array of same length as said stored binary word which generates an output selected from the group consisting of:

the carry-out bit for the summation of a binary word applied to it, the bitwise inversion of the binary word stored in the array, and a carry-in value applied at its input, and, the carry-out bit for the summation of the bitwise inversion of a binary word applied to it, the binary word stored in the array, and a carry-in value applied at its input;

(b) setting a logical carry-in value of 1 at said input of said content comparing memory, (c) storing said stored binary word as it is in said content comparing memory array, (d) observing the fact that when binary number 1 is added to the summation of a number x and the bitwise inversion of a number y, said carry-out bit will be 1 if x>y and it will be 0 if x<y, whereby, from said output of said content comparing memory it can be judged whether said search binary word is larger than said stored binary word or not.

* * * * *